(12) United States Patent
Kim

(10) Patent No.: US 12,745,619 B2
(45) Date of Patent: Sep. 22, 2026

(54) SEMICONDUCTOR DEVICE AND METHOD OF MANUFACTURING SEMICONDUCTOR DEVICE

(71) Applicant: SK hynix Inc., Icheon-si (KR)

(72) Inventor: Jae Taek Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 466 days.

(21) Appl. No.: 18/346,640

(22) Filed: Jul. 3, 2023

(65) Prior Publication Data

US 2024/0266280 A1 Aug. 8, 2024

(30) Foreign Application Priority Data

Feb. 3, 2023 (KR) ........................ 10-2023-0014669

(51) Int. Cl.

| | |
|---|---|
| ***H01L 23/522*** | (2006.01) |
| ***H10B 41/10*** | (2023.01) |
| ***H10B 43/10*** | (2023.01) |
| ***H10W 20/42*** | (2026.01) |
| *H10B 41/27* | (2023.01) |
| *H10B 41/40* | (2023.01) |
| *H10B 43/27* | (2023.01) |
| *H10B 43/40* | (2023.01) |

(52) U.S. Cl.

CPC ............ *H10W 20/42* (2026.01); *H10B 41/10* (2023.02); *H10B 43/10* (2023.02); *H10B 41/27* (2023.02); *H10B 41/40* (2023.02); *H10B 43/27* (2023.02); *H10B 43/40* (2023.02)

(58) Field of Classification Search

CPC ......... H01L 21/76805; H01L 21/76816; H01L 21/76831; H01L 23/5226; H10B 41/10; H10B 41/27; H10B 41/40; H10B 41/50; H10B 43/10; H10B 43/27; H10B 43/40; H10B 43/50

See application file for complete search history.

(56) References Cited

U.S. PATENT DOCUMENTS

| | | | | |
|---|---|---|---|---|
| 6,759,333 | B2 * | 7/2004 | Okajima | H10B 12/482<br>438/677 |
| 9,484,296 | B2 * | 11/2016 | Takahashi | H10W 20/42 |
| 10,373,969 | B2 * | 8/2019 | Zhang | H10B 43/35 |
| 2016/0240476 | A1 * | 8/2016 | Takahashi | H10W 20/42 |
| 2022/0093635 | A1 * | 3/2022 | Lee | H10B 43/27 |
| 2022/0093644 | A1 * | 3/2022 | Sharangpani | H10D 30/6891 |
| 2022/0123008 | A1 * | 4/2022 | Lee | H10B 43/40 |
| 2022/0139946 | A1 * | 5/2022 | Takaki | H10B 43/10<br>257/314 |
| 2024/0194597 | A1 * | 6/2024 | Kwon | H10W 20/435 |

FOREIGN PATENT DOCUMENTS

| | | |
|---|---|---|
| KR | 1020220057896 A | 5/2022 |

* cited by examiner

*Primary Examiner* — Jaehwan Oh

(74) *Attorney, Agent, or Firm* — WILLIAM PARK AND ASSOCIATES LTD.

(57) ABSTRACT

A semiconductor device includes a stack disposed over a peripheral circuit. The stack includes alternately stacked insulating layers and sacrificial layers. The semiconductor device also includes a first contact structure penetrating through the stack to connect with the peripheral circuit. The first contact structure includes a protruding part extending outward from a sidewall of the first contact structure. The semiconductor device further includes a second contact structure disposed on the first contact structure. The second contact structure is connected to the protruding part of the first contact structure.

10 Claims, 15 Drawing Sheets

SEMICONDUCTOR DEVICE AND METHOD OF MANUFACTURING SEMICONDUCTOR DEVICE

CROSS-REFERENCE TO RELATED APPLICATION

This application claims priority under 35 U.S.C. § 119(a) to Korean Patent Application No. 10-2023-0014669 filed on Feb. 3, 2023, in the Korean Intellectual Property Office, which is incorporated herein by reference in its entirety.

BACKGROUND

1. Technical Field

Embodiments relate to an electronic device and a method of manufacturing an electronic device, and more particularly, to a semiconductor device and a method of manufacturing a semiconductor device.

2. Related Art

The degree of integration of semiconductor devices is basically determined by an area that is occupied by a unit memory cell. As the improvements of the degree of integration of semiconductor devices in which memory cells are formed on a substrate as a single layer recently reaches its limit, there is proposed a three-dimensional (3-D) semiconductor device in which memory cells are stacked on a substrate. Furthermore, to improve operation reliability of such a semiconductor device, various structures and manufacturing methods are being developed.

SUMMARY

In an embodiment, a semiconductor device may include: a peripheral circuit; a stack that is disposed over the peripheral circuit, the stack including alternately stacked insulating layers and sacrificial layers; a first contact structure penetrating through the stack to connect with the peripheral circuit, the first contact structure comprising a protruding part extending outward from a sidewall of the first contact structure; and a second contact structure disposed on the first contact structure, wherein the second contact structure is connected to the protruding part of the first contact structure.

In an embodiment, a semiconductor device may include: a gate structure including alternately stacked conductive layers and insulating layers; channel structures extending through the gate structure; a stack including alternately stacked sacrificial layers and insulating layers; a first interlayer insulating layer disposed on the gate structure and the stack; a second interlayer insulating layer disposed on the first interlayer insulating layer; a first contact structure that extends through the first interlayer insulating layer and the stack, the first contact structure including a protruding part extending outward from a sidewall of the first contact structure; a second contact structure connected to the protruding part of the first contact structure through the second interlayer insulating layer; and third contact structures connected to the channel structures through the first interlayer insulating layer.

In an embodiment, a method of manufacturing a semiconductor device may include: forming a stack including first material layers and second material layers that are alternately stacked; forming a first interlayer insulating layer on the stack; forming, within the first interlayer insulating layer and the stack, a first contact structure including a protruding part that extends outward from a sidewall of the first contact structure; forming a second interlayer insulating layer on the first interlayer insulating layer; and forming, within the second interlayer insulating layer, a second contact structure connected to the protruding part of the first contact structure.

DETAILED DESCRIPTION

Hereinafter, embodiments according to the technical spirit of the present disclosure are described with reference to the accompanying drawings.

An embodiment of the present disclosure provides a semiconductor device having a stable structure and improved characteristics and a method of manufacturing the semiconductor device.

The present technology can provide a semiconductor device having a stable structure and improved reliability.

Figure 1A:
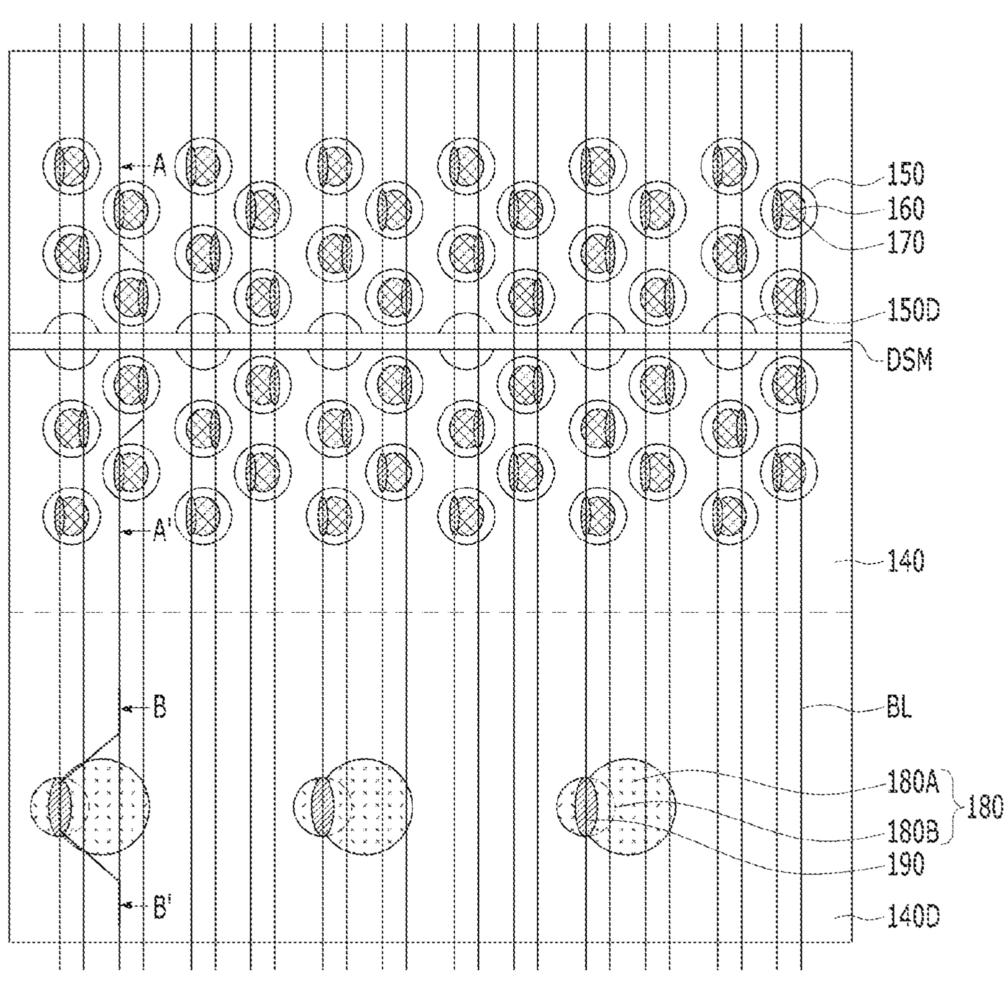
FIGS. 1A to 1C are diagrams for describing a semiconductor device according to an embodiment of the present disclosure.
Figure 1B:
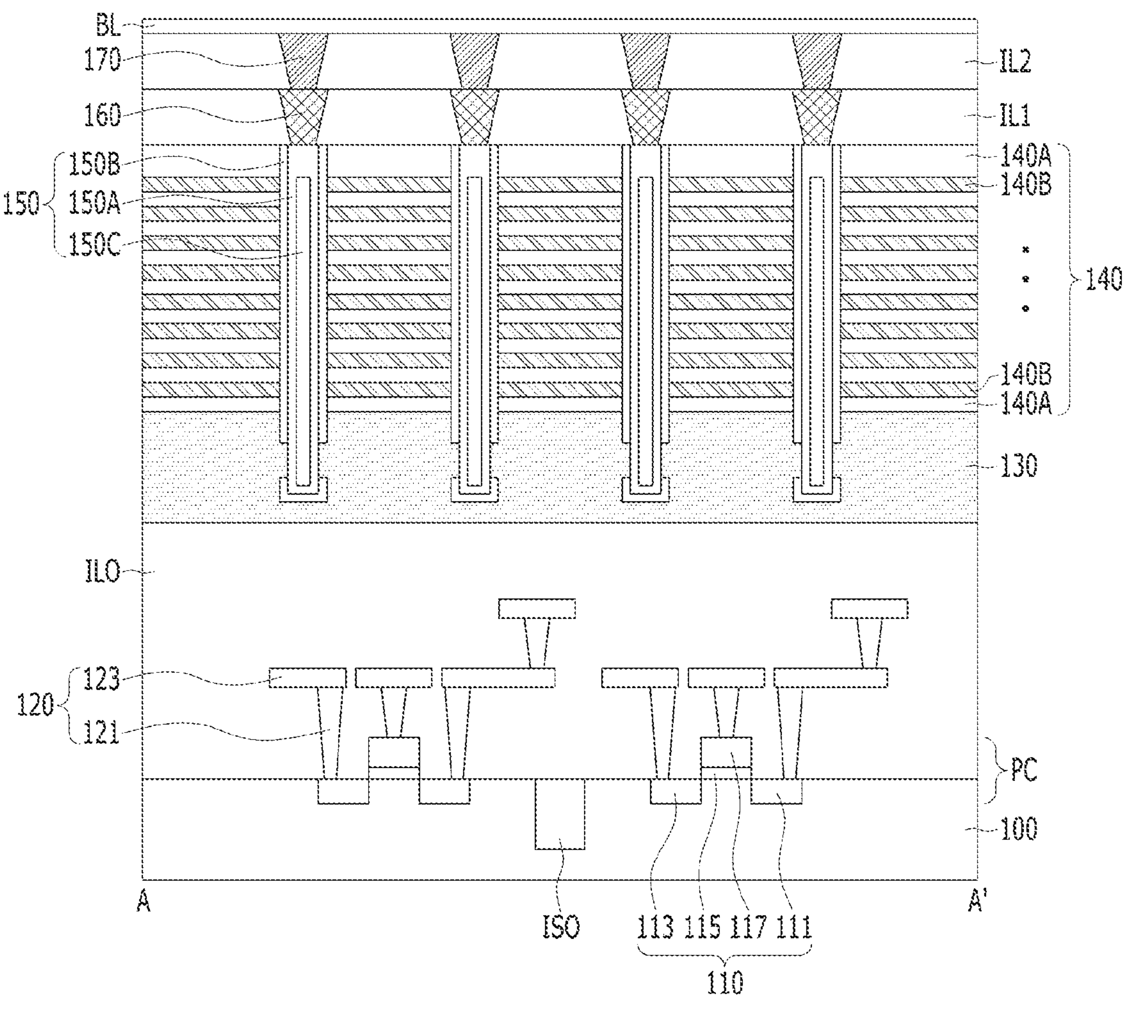
Figure 1C:
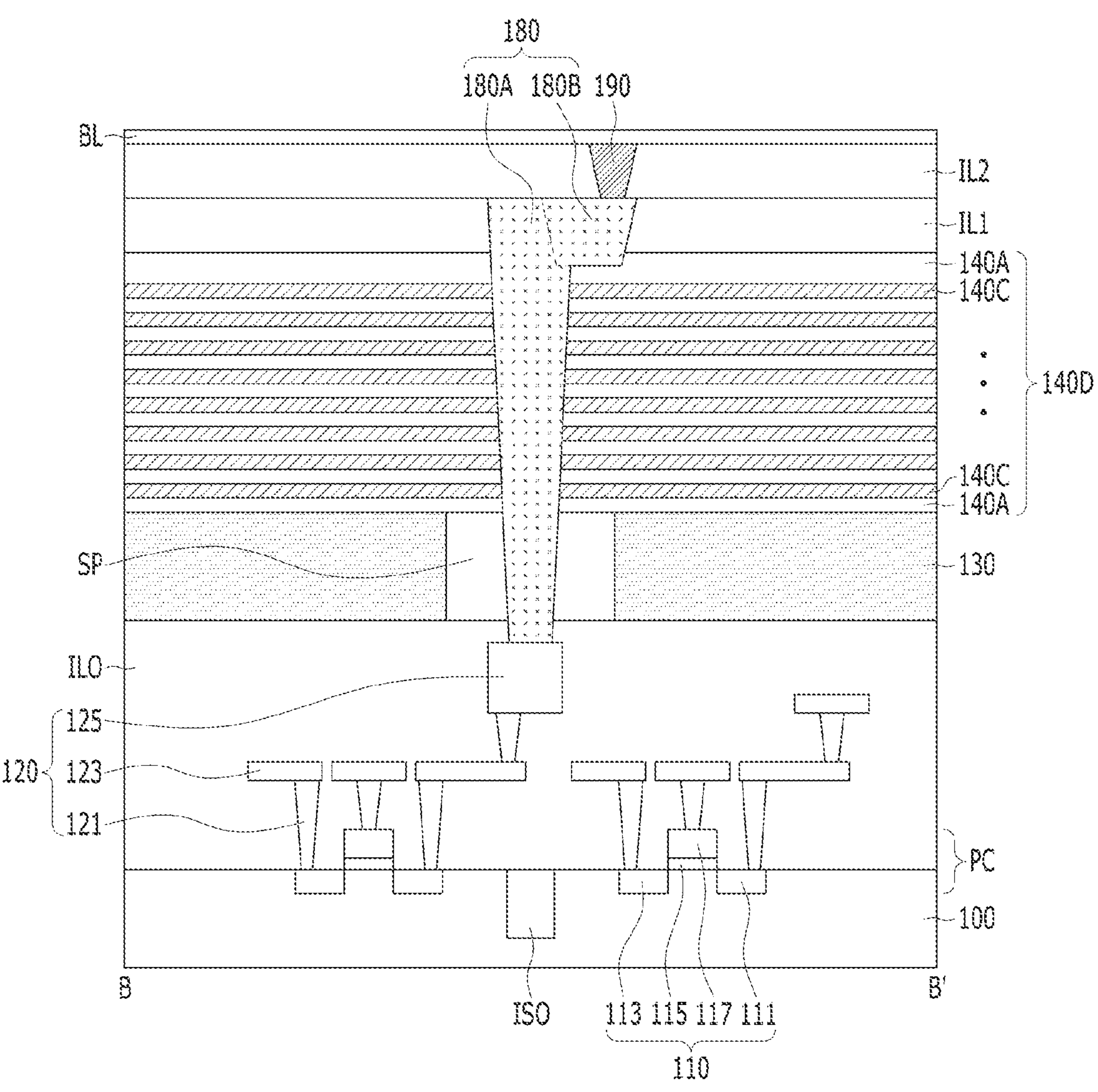

FIGS. 1A to 1C are diagrams for describing a semiconductor device according to an embodiment of the present disclosure. FIG. 1A is a plan view of the semiconductor device. FIG. 1B is a cross-sectional view taken along line A-A' in FIG. 1A. FIG. 1C is a cross-sectional view taken along line B-B' in FIG. 1A.

Referring to FIGS. 1A to 1C, the semiconductor device may include a source structure 130, a gate structure 140, a stack 140D, channel structures, a first contact structure 180, a second contact structure 190, a third contact structure 160, a fourth contact structure 170, and bit lines BL, or may include the source structure 130, the gate structure 140, the stack 140D, the channel structures, the first contact structure 180, the second contact structure 190, the third contact structure 160, the fourth contact structure 170, and the bit lines BL in combination. The semiconductor device may further include a substrate 100, a peripheral circuit PC, an interconnection structure 120, an underlying interlayer insulating layer IL0, a first interlayer insulating layer IL1, a second interlayer insulating layer IL2, and a separation insulating layer DSM, or may further include the substrate 100, the peripheral circuit PC, the interconnection structure 120, the underlying interlayer insulating layer IL0, the first interlayer insulating layer IL1, the second interlayer insulating layer IL2, and the separation insulating layer DSM in combination.

The peripheral circuit PC may be disposed on the substrate 100. The substrate 100 may be a semiconductor substrate, such as a silicon wafer, a SiGe wafer, or an SOI wafer. An isolation layer ISO may be disposed within the substrate 100. An active area may be defined by the isolation layer ISO. The peripheral circuit PC may include a transistor 110, a capacitor, and a register. The transistor 110 may include at least one of a first junction 111, a second junction 113, a gate insulating layer 115, and a gate electrode 117. The gate electrode 117 may be disposed on the substrate 100. The gate electrode 117 may include a conductive material. The first junction 111 and the second junction 113 may be disposed within the substrate 100 on both sides of the gate electrode 117. The first junction 111 or the second junction 113 may include n type or p type impurities. The gate insulating layer 115 may be disposed between the gate electrode 117 and the substrate 100. The gate insulating layer 115 may include an insulating material, such as an oxide, or a nitride.

The interconnection structure 120 may be disposed on the peripheral circuit PC. The interconnection structure 120 may be disposed in the underlying interlayer insulating layer IL0. The interconnection structure 120 may include at least one of contact plugs 121, wires 123, and a pad 125. The interconnection structure 120 may include a conductive material, such as aluminum, copper, or tungsten. The underlying interlayer insulating layer IL0 may include an insulating material, such as an oxide, or a nitride.

The gate structure 140 may be disposed over the peripheral circuit PC. The source structure 130 may be disposed under the gate structure 140. The gate structure 140 may include insulating layers 140A and conductive layers 140B that are alternately stacked. The conductive layers 140B may each be a word line, a bit line, or a selection line. For example, at least one conductive layer that is disposed on the lower side of the conductive layers 140B may be a source selection line. At least one conductive layer that is disposed on the upper side of the conductive layers 140B may be a drain selection line. The remaining conductive layers 140B may be word lines. The insulating layers 140A may include an insulating material, such as an oxide. The conductive layers 140B may include a metal material, such as tungsten, or may include a silicide material.

The channel structures may be disposed within the gate structure 140. For example, the channel structures may extend through the gate structure 140. The channel structures may include real channel structures 150 and dummy channel structures 150D. Each of the real channel structures 150 may include a channel layer 150A. Each of the real channel structures 150 may further include at least one of a memory layer 150B that surrounds the sidewall of the channel layer 150A and an insulating core 150C within the channel layer 150A. The channel layer 150A may include a semiconductor material, such as silicon or germanium. The memory layer 150B may include at least one of a blocking layer, a data storage layer, and a tunneling layer. The insulating core 150C may include an insulating material, such as an oxide, a nitride, or an air gap. Each of the dummy channel structures 150D may include at least one of a dummy memory layer, a dummy channel layer, or a dummy insulating core.

The real channel structure may extend through the gate structure 140, and may be connected to the source structure 130. For example, the channel layer 150A and the source structure 130 may be directly connected, or the channel layer 150A and the source structure 130 may be connected through a semiconductor pattern that is grown by an epitaxial method. In this case, the source structure 130 may include a sacrificial layer.

The separation insulating layer DSM may be disposed within the gate structure 140. The separation insulating layer DSM may penetrate a part of the gate structure 140. The separation insulating layer DSM may be disposed between the channel structures or may overlap at least one channel structure. For example, the separation insulating layer DSM may overlap the dummy channel structures 150D. The separation insulating layer DSM may electrically separate drain selection lines that are disposed at the same level. Accordingly, the drain selection lines can be individually driven. Accordingly, the separation insulating layer DSM may have a depth by a level corresponding to the drain selection lines. The separation insulating layer DSM may include an insulating material, such as an oxide or a nitride.

The first interlayer insulating layer IL1 may be disposed on the gate structure 140. The third contact structures 160 may be disposed within the first interlayer insulating layer IL1. The third contact structures 160 may be connected to the real channel structures 150, respectively, through the first interlayer insulating layer IL1. The third contact structures 160 may include a conductive material, such as tungsten.

The fourth contact structures 170 may be disposed within the second interlayer insulating layer IL2. The fourth contact structures 170 may be connected to the third contact structures 160, respectively, through the second interlayer insulating layer IL2. The fourth contact structures 170 may include a conductive material, such as tungsten.

The stack 140D may be disposed over the peripheral circuit PC. The source structure 130 may be disposed under the stack 140D. The stack 140D may be disposed substantially at the same level as the gate structure 140. The first interlayer insulating layer IL1 may be disposed on the stack 140D. For example, the first interlayer insulating layer IL1 may be disposed on the stack 140D and the gate structure 140. The stack 140D may include insulating layers 140A and sacrificial layers 140C that are alternately stacked. The insulating layers 140A may include an insulating material, such as an oxide. The sacrificial layers 140C may include a sacrificial material, such as a nitride. The first interlayer insulating layer IL1 may include an insulating material, such as an oxide or a nitride.

The first contact structure 180 may be disposed within the first interlayer insulating layer IL1 and the stack 140D. For example, the first contact structure 180 may extend through the first interlayer insulating layer IL1 and the stack 140D. The first contact structure 180 may include a pillar 180A and a protruding part 180B that protrudes from the sidewall of the pillar 180A. The protruding part 180B of the first contact structure 180 may be disposed substantially at the same level as the third contact structures 160. For example, the upper surface of the protruding part 180B may be disposed substantially at the same level as the upper surfaces of the third contact structures 160.

The first contact structure 180 may be connected to the peripheral circuit PC through the stack 140D. For example, the pillar 180A may be connected to the pad 125 of the interconnection structure 120 through the stack 140D, and may be electrically connected to the peripheral circuit PC. In this case, insulating spacers SP that are disposed at the same level as the source structure 130 may surround the sidewall of the pillar 180A. The first contact structure 180 may include a conductive material, such as tungsten.

The protruding part 180B may be disposed within the first interlayer insulating layer IL1, and may extend into the stack 140D. For example, the protruding part 180B may be disposed within the top insulating layer 140A of the stack 140D and the first interlayer insulating layer IL1. The size of the protruding part 180B on a plane may be substantially identical with or different from the size of the third contact structures 160 on the plane. For example, the size of the protruding part 180B may be greater than the size of the third contact structures 160. The first contact structure 180 may be electrically connected to even a place other than the pillar 180A by including the protruding part 180B on the sidewall of the first contact structure 180. Although the second contact structure 190 is misaligned with the first contact structure 180 in its manufacturing process, the second contact structure 190 may be connected to the first contact structure 180 through the protruding part 180B. For example, although misalignment may occur in a process of forming the second contact structure 190 so that the second contact structure 190 is not connected to the pillar 180A of the first contact structure 180, the second contact structure 190 may still be connected to the protruding part 180B of the first contact structure 180.

The second contact structure 190 may be disposed on the first contact structure 180. For example, the second contact structure 190 may be connected to the protruding part 180B. The second contact structure 190 may be disposed within the second interlayer insulating layer IL2. The second contact structure 190 may be connected to the protruding part 180B through the second interlayer insulating layer IL2. The second interlayer insulating layer IL2 may be disposed on the first interlayer insulating layer IL1. The second contact structure 190 may be disposed substantially at the same level as the fourth contact structures 170. The upper surface of the second contact structure 190 may be disposed substantially at the same level as the upper surfaces of the fourth contact structures 170. The second contact structure 190 may include a conductive material, such as tungsten. The second interlayer insulating layer IL2 may include an insulating material, such as an oxide or a nitride.

The bit line BL may be disposed on the second interlayer insulating layer IL2. The bit line BL may be connected to the peripheral circuit PC. For example, the bit line BL may be electrically connected to the peripheral circuit PC through the second contact structure 190 and the first contact structure 180. The bit line BL may be connected to the real channel structures 150. For example, the bit line BL may be connected to the real channel structures 150 through the fourth contact structures 170 and the third contact structures 160. The bit line BL may be connected to the first contact structure 180 through the second contact structure 190, and may be connected to the real channel structures 150 through the fourth contact structures 170 and the third contact structures 160.

According to the aforementioned structure, the first contact structure 180 may include the protruding part 180B. Accordingly, although misalignment may occur in a process of forming the second contact structure 190 so that the second contact structure 190 is not connected to the pillar 180A of the first contact structure 180, the second contact structure 190 can still be connected to the protruding part 180B of the first contact structure 180.

Furthermore, the bit line BL may be electrically connected to the peripheral circuit PC through the first contact structure 180, and may be connected to the real channel structures 150 through the fourth contact structures 170 and the third contact structures 160.

FIGS. 2A to 2C, 3A to 3C, 4A to 4C, and 5A to 5C are diagrams for describing a method of manufacturing a semiconductor device according to an embodiment of the present disclosure. FIGS. 2A, 3A, 4A, and 5A are plan views of the semiconductor device. FIGS. 2B, 3B, 4B, and 5B are cross-sectional views taken along line C-C'. FIGS. 2C, 3C, 4C, and 5C are cross-sectional views taken along line D-D'. Hereinafter, contents redundant with the aforementioned contents are omitted.

Figure 2A:
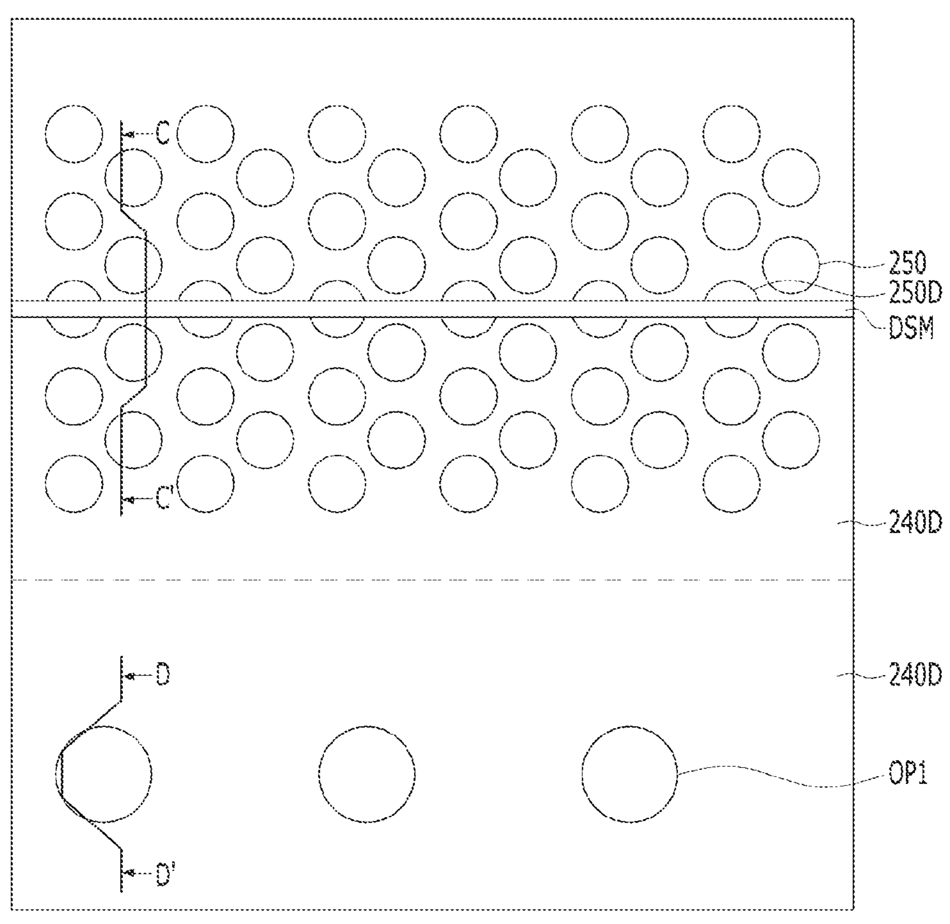
FIGS. 2A to 2C, 3A to 3C, 4A to 4C, and 5A to 5C are diagrams for describing a method of manufacturing a semiconductor device according to an embodiment of the present disclosure.
Figure 2B:
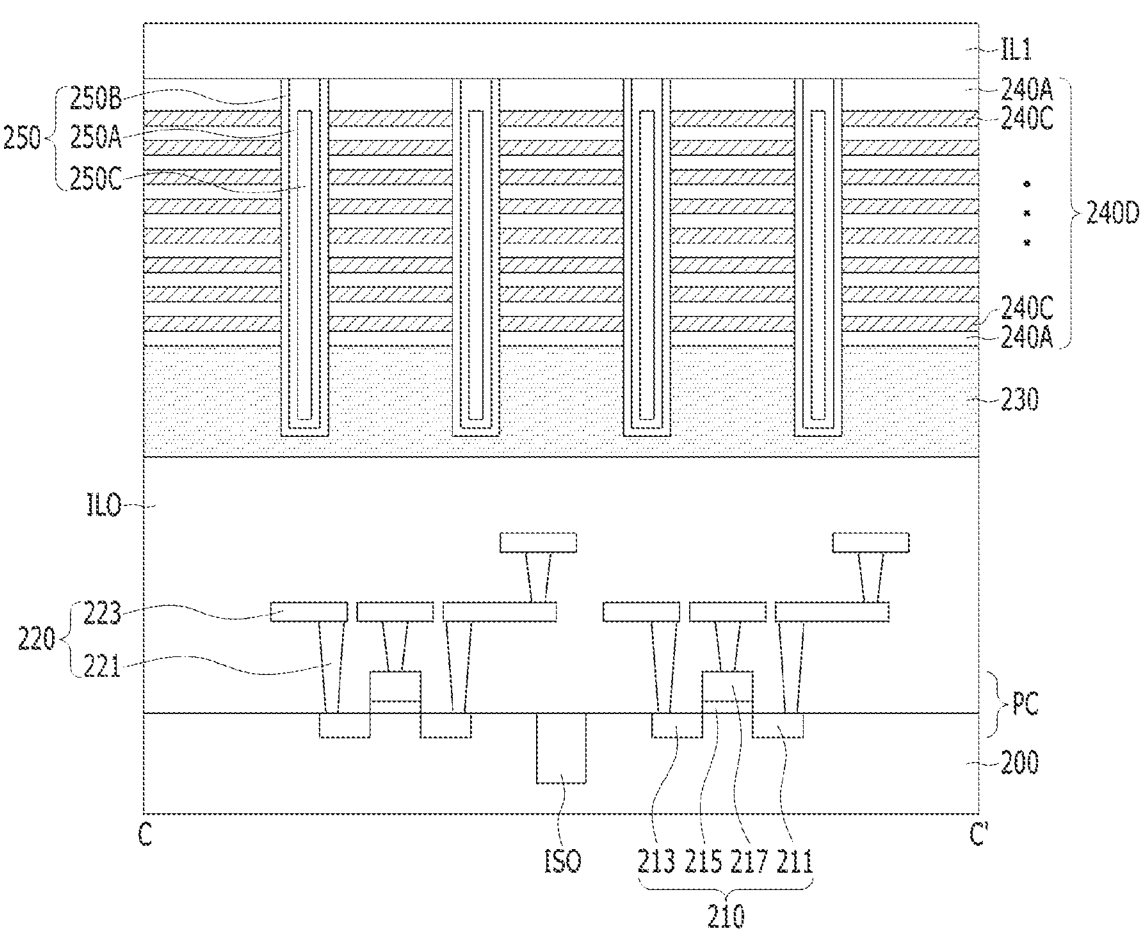
Figure 2C:
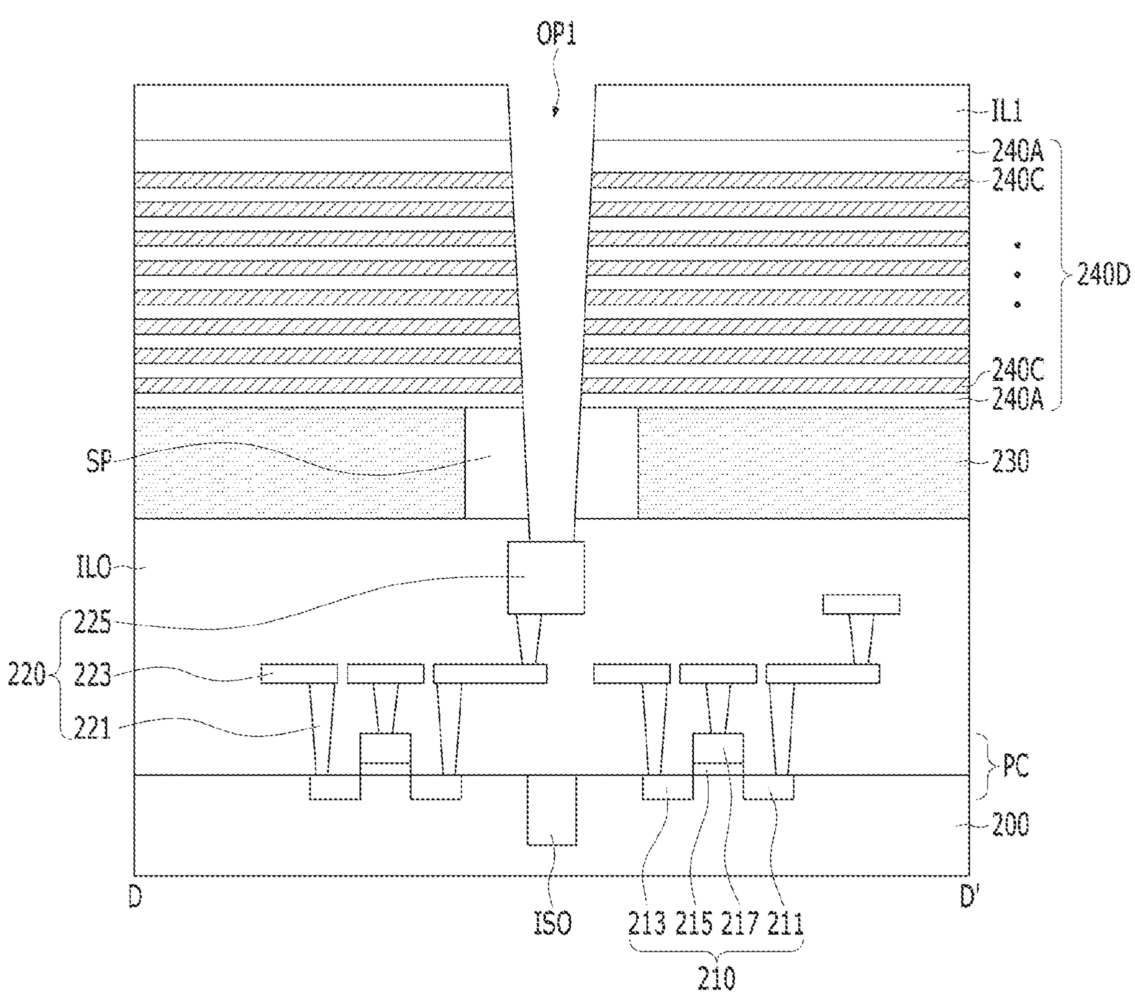

Referring to FIGS. 2A to 2C, a peripheral circuit PC may be formed in a substrate 200. The peripheral circuit PC may include a transistor 210, a capacitor, and a register. The transistor 210 may include at least one of a first junction 211, a second junction 213, a gate insulating layer 215, and a gate electrode 217. An interconnection structure 220 may be formed on the peripheral circuit PC. The interconnection structure 220 may include at least one of contact plugs 221, wires 223, and a pad 225. The interconnection structure 220 may be formed within an underlying interlayer insulating layer IL0. The interconnection structure 220 may include a conductive material, such as tungsten.

Next, a source structure 230 may be formed on the peripheral circuit PC. Next, an insulating layer may be formed within the source structure 230. The insulating layer may be for forming an insulating spacer SP that insulates the source structure 230 and a first contact structure (not illustrated) that is formed through a first opening OP1 in a subsequent process.

Next, a stack 240D may be formed on the source structure 230. The stack 240D may include first material layers 240A and second material layers 240C that are alternately stacked. The first material layers 240A may include an insulating material, such as an oxide. The second material layers 240C may include a sacrificial material, such as a nitride. The second material layers 240C may be substituted with third material layers, and each may be used as a word line, a bit line, or a selection line. For example, at least one third material layer that is disposed on the lower side of the third material layers may be used as a source selection line. At least one third material layer that is disposed on the upper side of the third material layers may be used as a drain selection line.

Next, channel structures may be formed within the stack 240D and the source structure 230. For example, the channel structures that extend through the stack 240D may be formed. The channel structures may include real channel structures 250 and dummy channel structures 250D. Each of the real channel structures 250 may include a channel layer 250A. Each of the real channel structures 250 may include at least one of a memory layer 250B that surrounds the sidewall of the channel layer 250A and an insulating core 250C within the channel layer 250A. The channel layer 250A may include a semiconductor material, such as silicon or germanium. The memory layer 250B may include a blocking layer, a data storage layer, or a tunneling layer, or may include the blocking layer, the data storage layer, and the tunneling layer in combination. The insulating core 250C may include an insulating material, such as an oxide, a nitride, or an air gap.

A separation insulating layer DSM may be formed within the stack 240D. The separation insulating layer DSM may be disposed between the channel structures or may be formed to overlap at least one channel structure. A channel structure that overlaps the separation insulating layer DSM may be the dummy channel structure 250D. The separation insulating layer DSM may electrically separate drain selection lines that are disposed at the same level. Accordingly, the drain selection lines can be individually driven. The separation insulating layer DSM may include an insulating material, such as an oxide or a nitride.

Next, a first interlayer insulating layer IL1 may be formed on the stack 240D. The first interlayer insulating layer IL1 may be formed on the channel structures. The first interlayer insulating layer IL1 may include an insulating material, such as an oxide or a nitride.

Next, the first opening OP1 may be formed within the first interlayer insulating layer IL1 and the stack 240D. The first opening OP1 may be formed to expose the pad 225 of the interconnection structure 220. When the first opening OP1 is formed, an insulating layer may be etched, and the remaining insulating layer may become the insulating spacer SP.

Figure 3A:
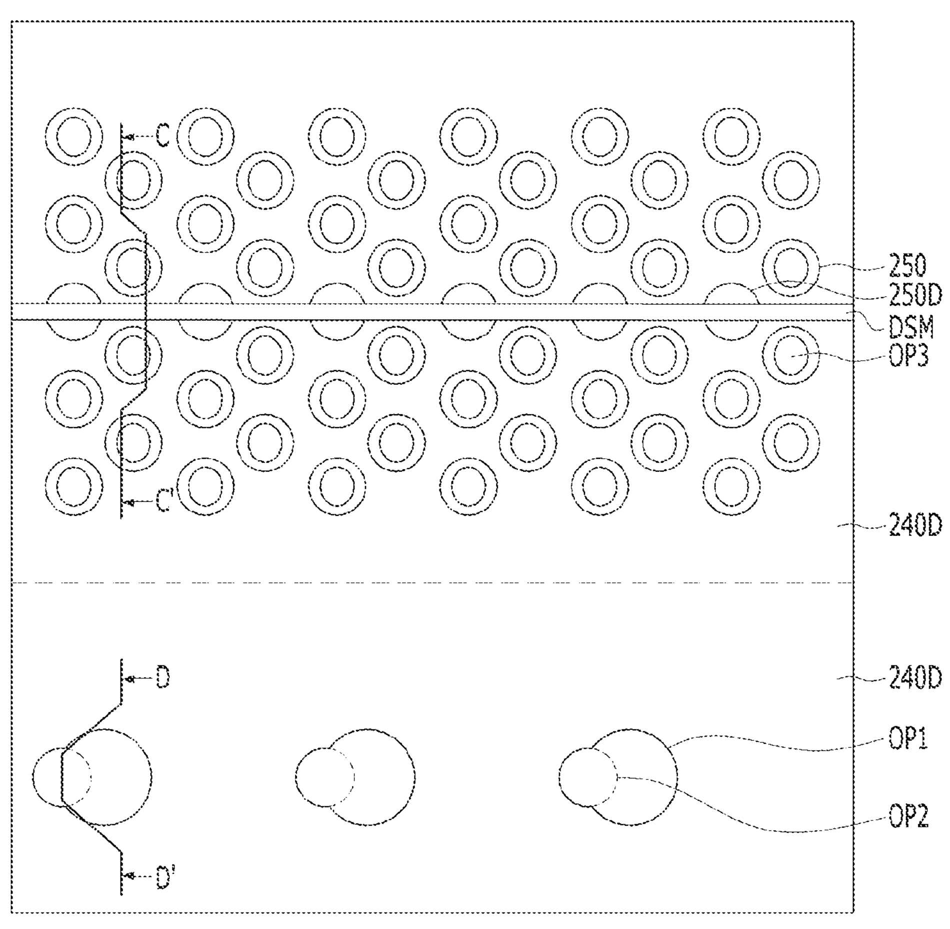
Figure 3B:
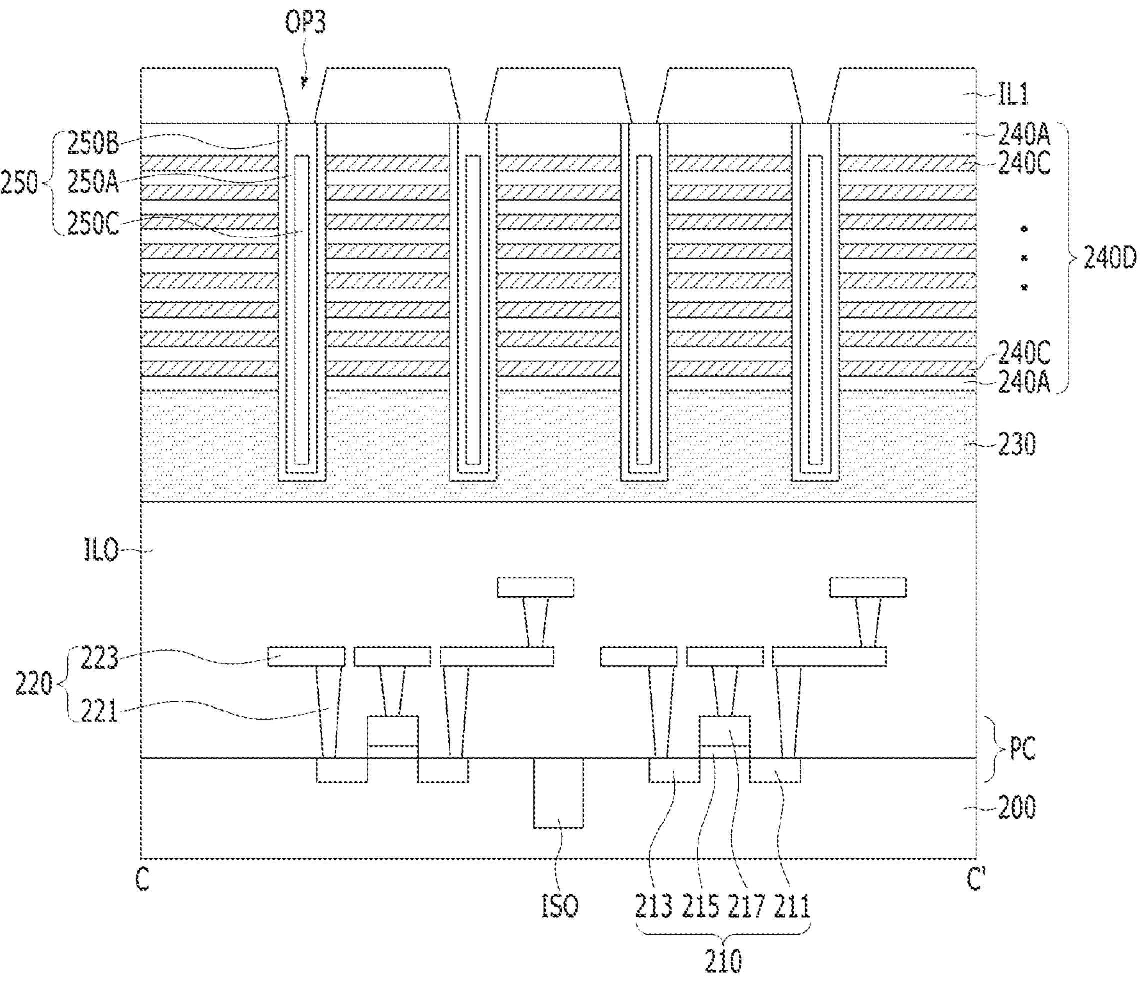
Figure 3C:
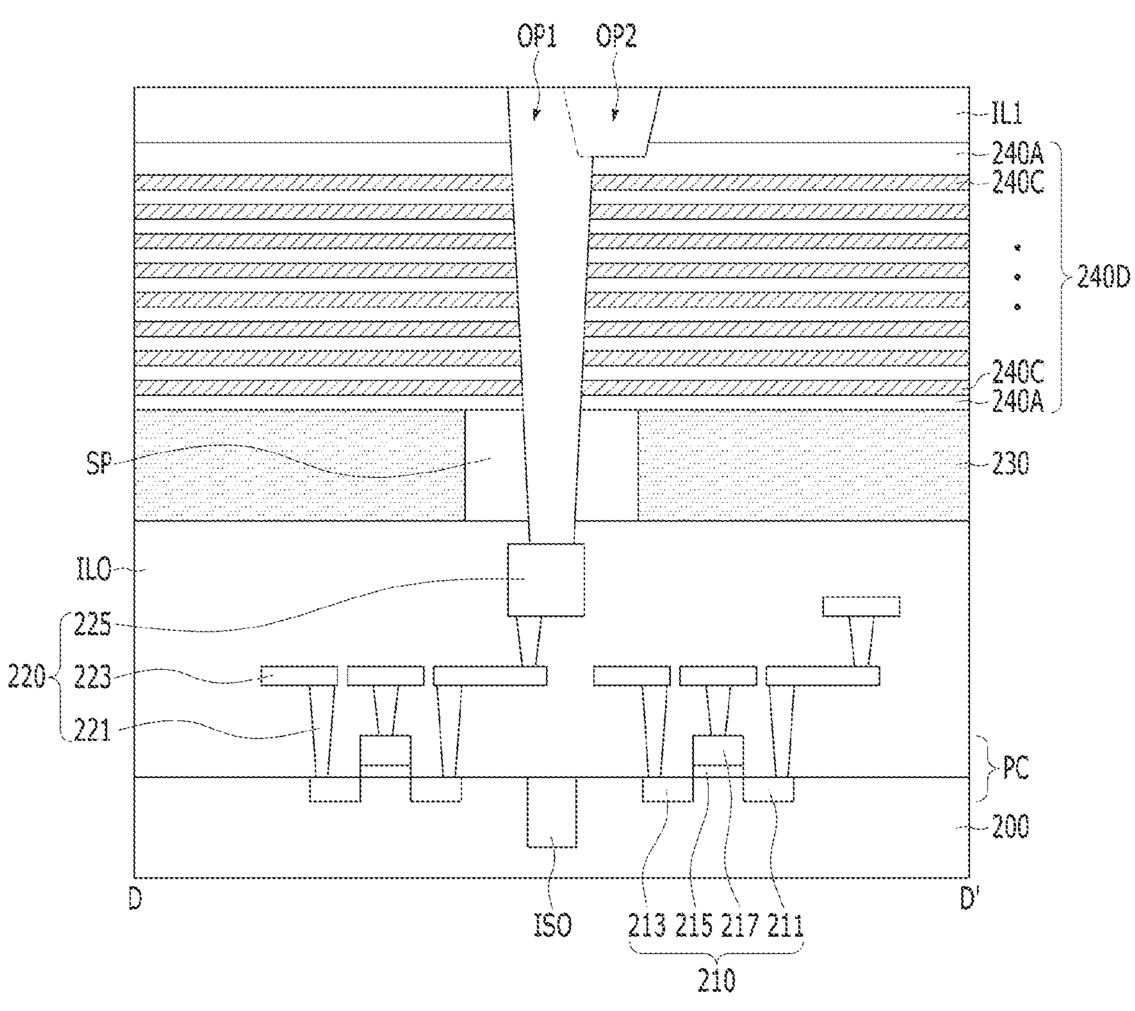

Referring to FIGS. 3A to 3C, third openings OP3 may be formed within the first interlayer insulating layer IL1. The third openings OP3 may be formed to expose the real channel structures 250, respectively. The third openings OP3 may be for forming third contact structures (not illustrated). The third openings OP3 might not be formed in the dummy channel structures 250D.

Next, a second opening OP2 may be formed within the first interlayer insulating layer IL1. The second opening OP2 may be formed to overlap a part of the sidewall of the first opening OP1. The second opening OP2 may extend into an insulating layer 240A that belongs to the insulating layers 240A of the stack 240D and that is disposed at the top of the stack 240D. The second opening OP2 may be for forming a protruding part (not illustrated) of a first contact structure (not illustrated). When the third opening OP3 is formed, the second opening OP2 may be simultaneously formed. In other words, when the third openings OP3 for forming the third contact structures (not illustrated) are formed, the second opening OP2 for a protruding part (not illustrated) may be formed. On a plane, the size of the second opening OP2 may be substantially identical with or different from the size of the third opening OP3. For example, the size of the second opening OP2 may be greater than the size of the third opening OP3.

For reference, a sacrificial layer may be formed within the first opening OP1 before the second opening OP2 and the third opening OP3 are formed. After the second opening OP2 is formed, the first opening OP1 may be opened again by removing the sacrificial layer.

Figure 4A:
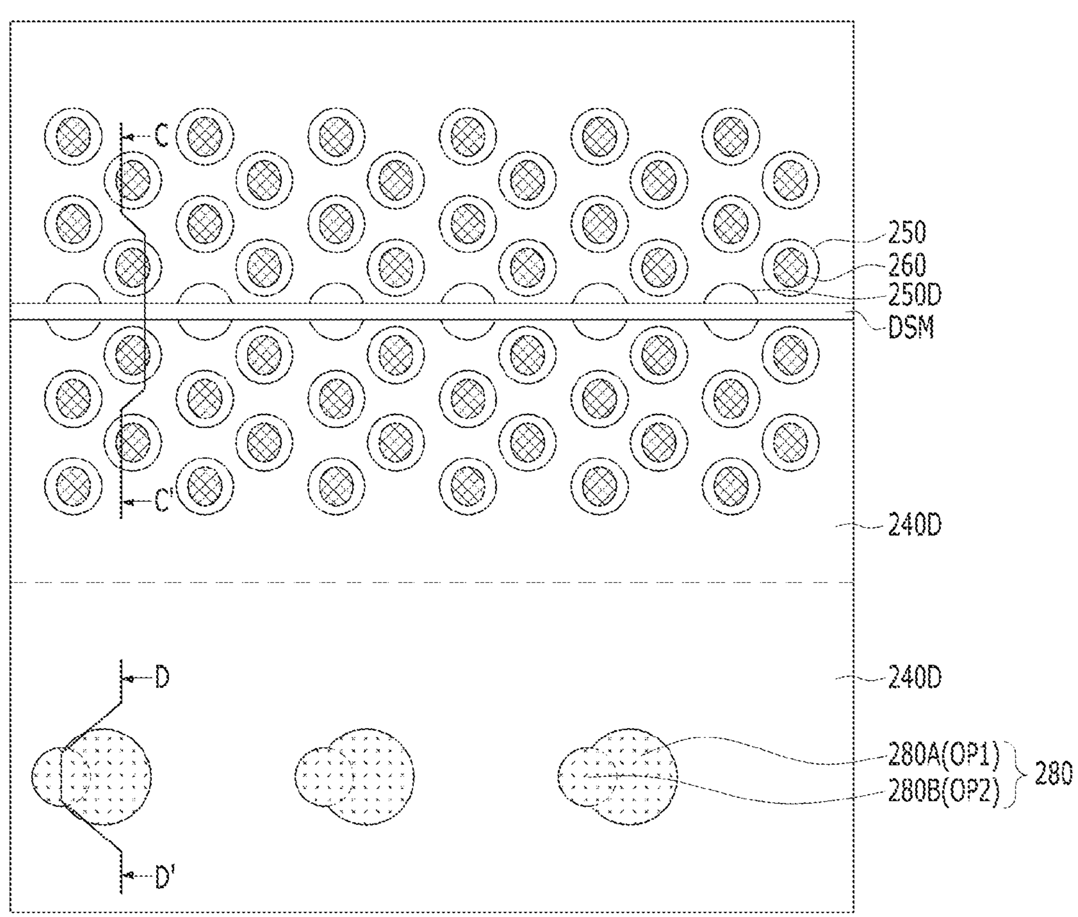
Figure 4B:
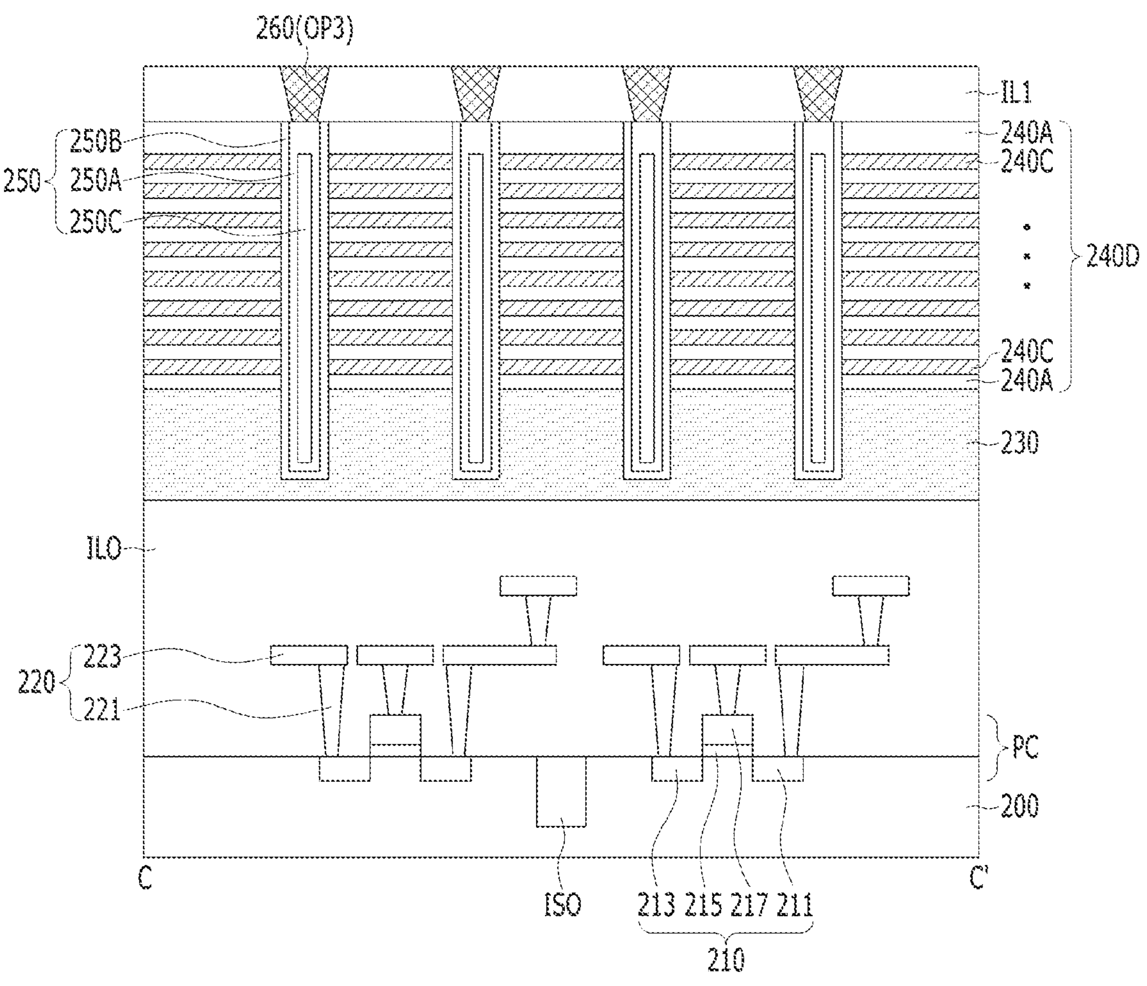
Figure 4C:
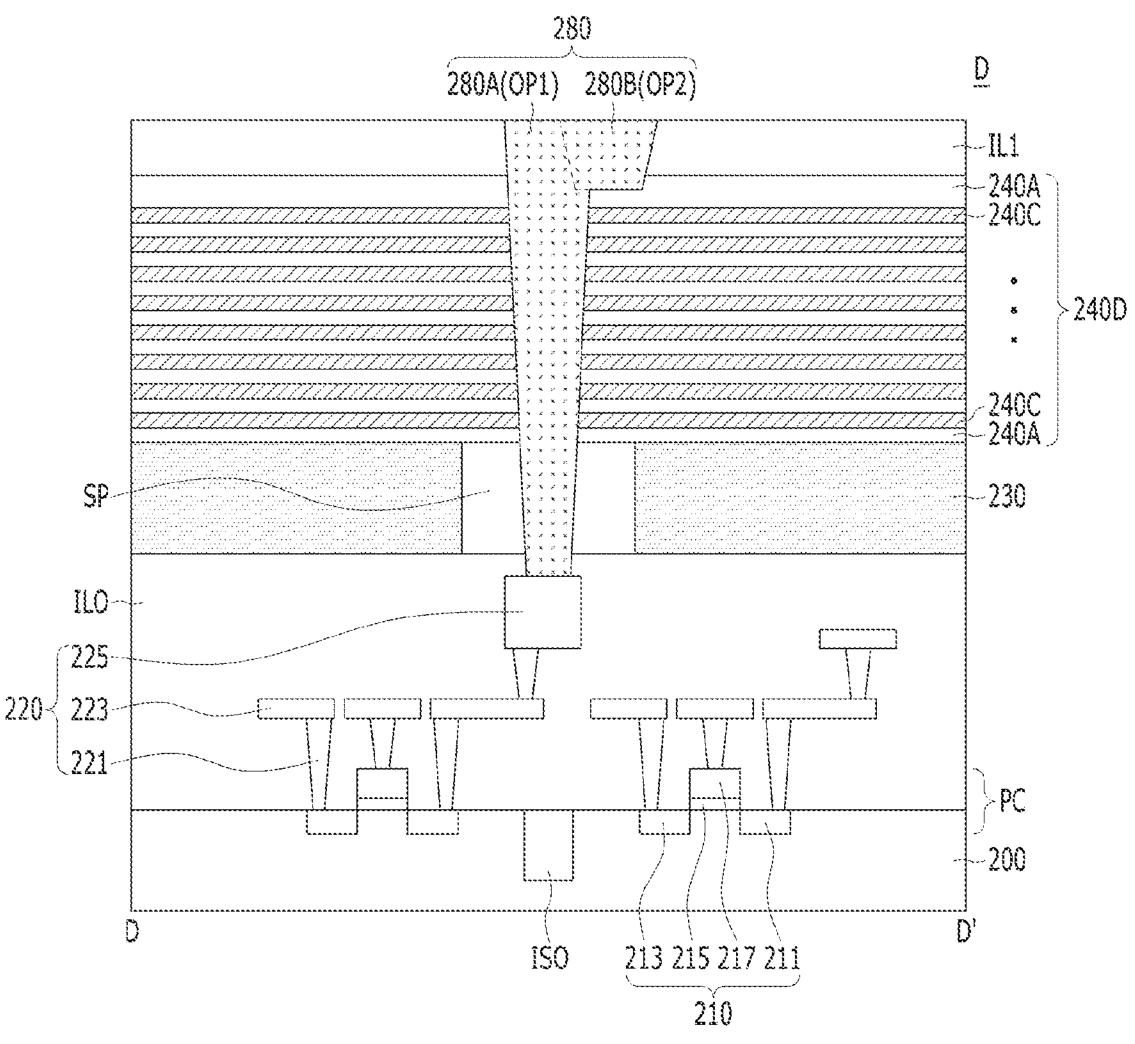

Referring to FIGS. 4A to 4C, third contact structures 260 may be formed within the third openings OP3, respectively. The third contact structures 260 may be formed within the first interlayer insulating layer IL1, and may be connected to the real channel structures 250, respectively. Because the third contact structures 260 are not connected to the dummy channel structures 250D, the dummy channel structures 250D may have an electrically floated state.

A first contact structure 280 may be formed by forming a conductive material within the first opening OP1 and the second opening OP2. When the third contact structure 260 is formed, the first contact structure 280 may be formed. Accordingly, a portion that belongs to the first contact structure 280 and that is formed within the first opening OP1 may be defined as a pillar 280A, and a portion that belongs to the first contact structure 280 and that is formed within the second opening OP2 may be defined as a protruding part 280B. Accordingly, the first contact structure 280 including the protruding part 280B that protrudes from the sidewall of the first contact structure 280 may be formed within the first interlayer insulating layer IL1 and the stack 240D.

Figure 5A:
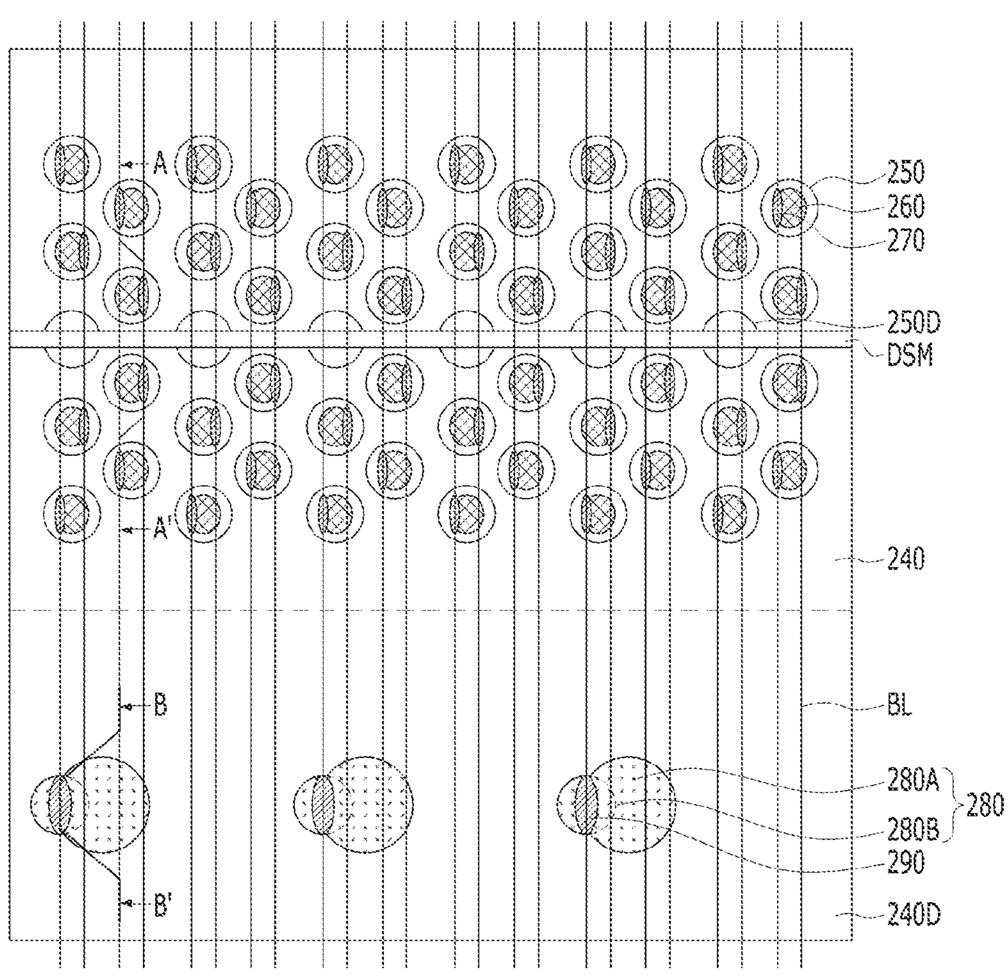
Figure 5B:
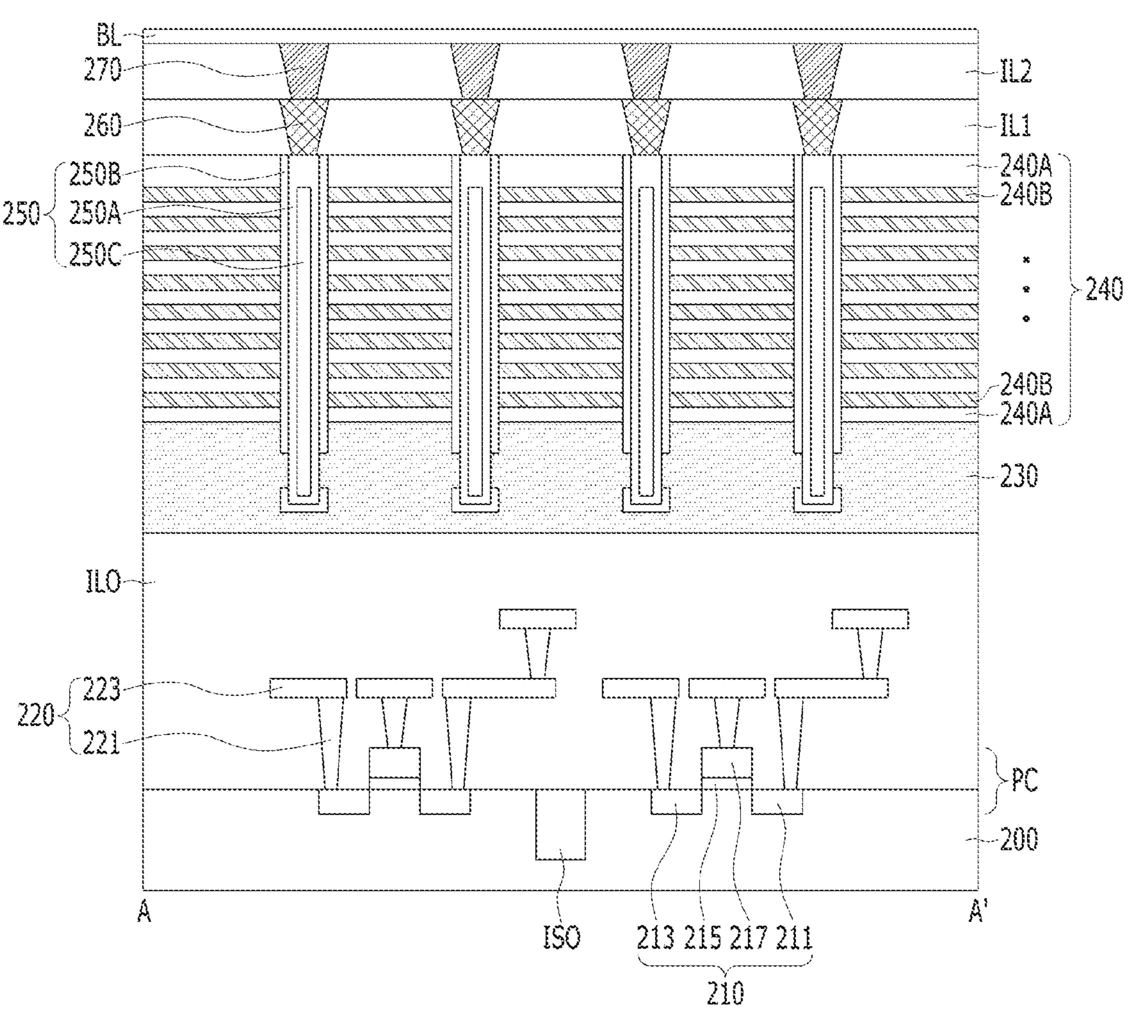
Figure 5C:
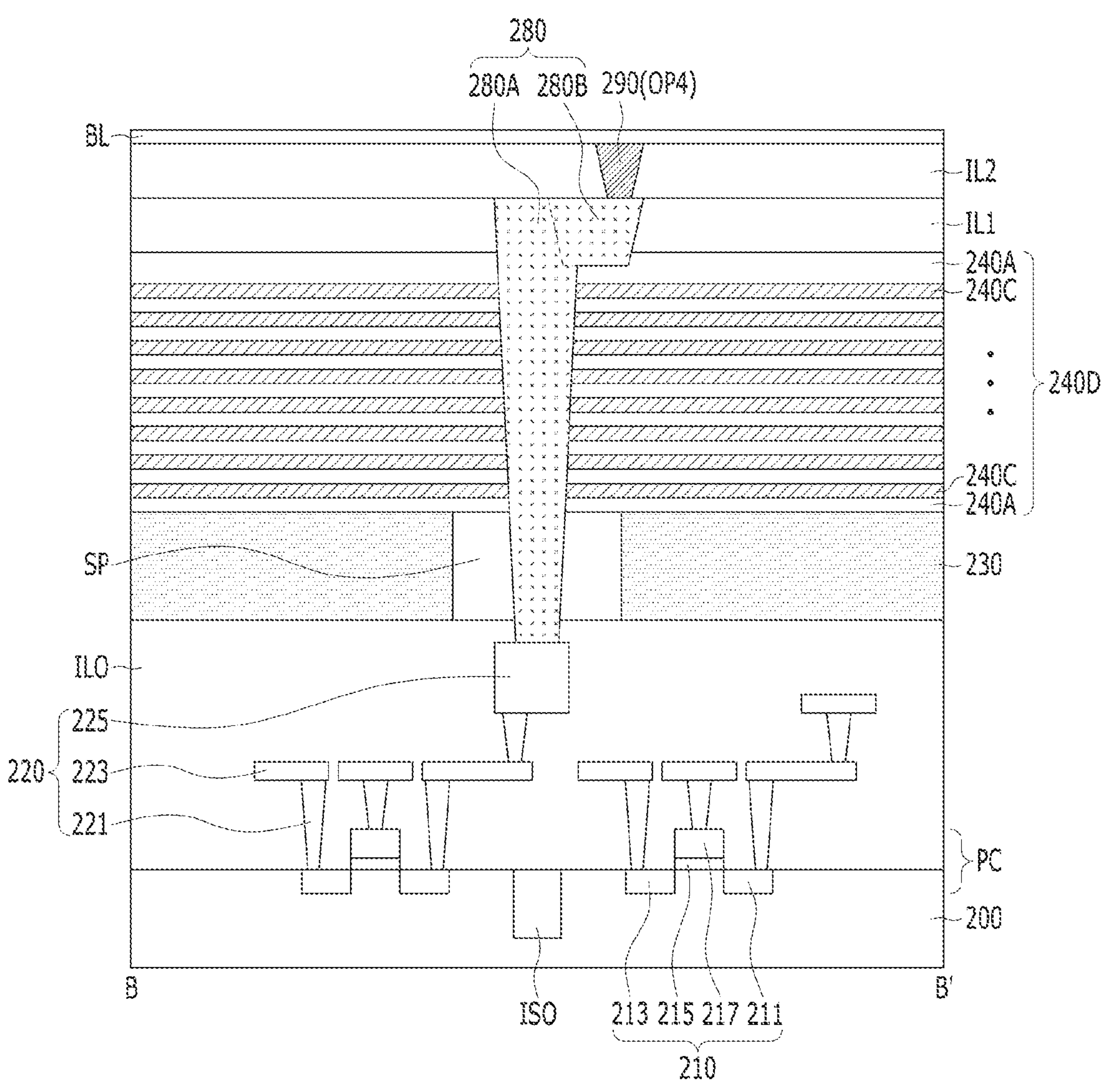

Referring to FIGS. 5A to 5C, a second interlayer insulating layer IL2 may be formed on the first interlayer insulating layer IL1. Next, fourth contact structures 270 that are connected to the third contact structures 260, respectively, may be formed within the second interlayer insulating layer IL2. Next, a second contact structure 290 that is connected to the first contact structure 280 may be formed within the second interlayer insulating layer IL2. When the fourth contact structures 270 are formed, the second contact structure 290 may be formed.

The second contact structure 290 may be formed within the second interlayer insulating layer IL2 so that the second contact structure 290 is connected to the protruding part 280B of the first contact structure 280. First, a fourth opening OP4 that exposes the protruding part 280B may be formed within the second interlayer insulating layer IL2. Next, the second contact structure 290 may be formed by forming a conductive material within the fourth opening OP4. The second contact structure 290 may be formed to be connected to the first contact structure 280. In this case, the second contact structure 290 may be formed to be connected to the pillar 280A or the protruding part 280B. Although misalignment may occur in a process of the second contact structure 290 being formed to be connected to the pillar 280A, the second contact structure 290 may still be connected to the protruding part 280B that protrudes from the pillar 280A. The second interlayer insulating layer IL2 may include an insulating material, such as an oxide or a nitride. The second contact structure 290 and the fourth contact structures 270 may include a conductive material, such as tungsten.

Next, a bit line BL may be formed on the fourth contact structures 270 or the second contact structure 290. The bit line BL may be connected to the real channel structures 250 through the fourth contact structures 270 and the third contact structures 260. The bit line BL may be electrically connected to the peripheral circuit PC through the second contact structure 290 and the first contact structure 280.

For reference, after a slit (not illustrated) is formed before the bit line BL is formed, an opening may be formed by removing a sacrificial layer of the source structure 230 through the slit, and the channel layer 250A may be exposed by etching the memory layer 250B. Next, the source structure 230 and the channel layer 250A may be electrically connected by forming a source layer within the opening. Next, the second material layers 240C of the stack 240D may be substituted with third material layers 240B through the slit. A portion that belongs to the second material layers 240C and that is close to the slit may be substituted with the third material layers 240B, and a portion that belongs to the second material layers 240C and that is separated from the slit may remain. Accordingly, a part of the stack 240D may be divided as the gate structure 240. The gate structure 240 may include the first material layers 240A and the third material layers 240B that are alternately stacked.

According to the aforementioned process, when the third openings OP3 for forming the third contact structure 260 are formed, the second opening OP2 for forming the protruding part 280B of the first contact structure 280 may be formed. Accordingly, the second opening OP2 can be formed without adding a separate process.

Furthermore, the protruding part 280B that protrudes from the sidewall of the pillar 280A of the first contact structure 280 may be formed by forming the second opening OP2 in a way to overlap the first opening OP1. Although misalignment may occur in a process of the second contact structure 290 being formed to be connected to the first contact structure 280, the second contact structure 290 can still be connected to the protruding part 280B of the first contact structure 280.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure.

What is claimed is:

1. A semiconductor device comprising:

a peripheral circuit;

a stack that is disposed over the peripheral circuit, the stack comprising alternately stacked insulating layers and sacrificial layers;

a first contact structure penetrating through the stack to connect with the peripheral circuit, the first contact structure including a pillar extending in a vertical direction and a protruding part extending outward from a sidewall of the pillar; and a second contact structure disposed on the first contact structure, wherein the second contact structure is connected to the protruding part of the first contact structure.

2. The semiconductor device of claim 1, further comprising:

a gate structure comprising conductive layers and the insulating layers that are alternately stacked;

channel structures extending through the gate structure;

a first interlayer insulating layer disposed on the gate structure; and third contact structures connected to the channel structures through the first interlayer insulating layer, the third contact structures having upper surfaces disposed at substantially a same level with an upper surface of the protruding part of the first contact structure.

3. The semiconductor device of claim 2, wherein:

the channel structures comprise real channel structures and dummy channel structures, and the third contact structures are connected to the real channel structures.

4. The semiconductor device of claim 3, further comprising:

a second interlayer insulating layer disposed on the first interlayer insulating layer; and fourth contact structures connected to the third contact structures, respectively, through the second interlayer insulating layer.

5. The semiconductor device of claim 4, further comprising a bit line connected to the real channel structures through the fourth contact structures and the third contact structures.

6. The semiconductor device of claim 1, wherein the protruding part is laterally offset from a center axis of the pillar, the center axis corresponding to the vertical direction.

7. A semiconductor device comprising:

a gate structure comprising alternately stacked conductive layers and insulating layers;

real channel structures extending through the gate structure;

a stack comprising alternately stacked sacrificial layers and insulating layers;

a first interlayer insulating layer disposed on the gate structure and the stack;

a second interlayer insulating layer disposed on the first interlayer insulating layer;

a first contact structure that extends through the first interlayer insulating layer and the stack, the first contact structure including a pillar extending in a vertical direction and a protruding part extending outward from a sidewall of the first contact structure;

a second contact structure disposed in the second interlayer insulating layer, overlapping the protruding part and connected to the protruding part; and third contact structures connected to the real channel structures through the first interlayer insulating layer.

8. The semiconductor device of claim 7, further comprising:

fourth contact structures connected to the third contact structures, respectively, through the second interlayer insulating layer;

a bit line connected to the first contact structure through the second contact structure and connected to the channel structures through the fourth contact structures and the third contact structures; and a peripheral circuit electrically connected to the bit line through the first contact structure and the second contact structure.

9. The semiconductor device of claim 7, wherein the second contact structure does not overlap the pillar.

10. The semiconductor device of claim 7, wherein an upper surface of the protruding part of the first contact structure and upper surfaces of the third contact structures are disposed at substantially a same level.

* * * * *